US008886146B2

(12) United States Patent
Andres et al.

(10) Patent No.: US 8,886,146 B2
(45) Date of Patent: Nov. 11, 2014

(54) INFRARED RECEIVING UNIT

(75) Inventors: Joerg Andres, Neustadt (DE); Dirk Reymann, Hambühren (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 301 days.

(21) Appl. No.: 13/123,764

(22) PCT Filed: Oct. 8, 2009

(86) PCT No.: PCT/EP2009/063086
§ 371 (c)(1),
(2), (4) Date: May 17, 2011

(87) PCT Pub. No.: WO2010/043535
PCT Pub. Date: Apr. 22, 2010

(65) Prior Publication Data
US 2011/0255880 A1    Oct. 20, 2011

(30) Foreign Application Priority Data
Oct. 13, 2008    (DE) .......................... 10 2008 051 011

(51) Int. Cl.
*H04B 17/00*    (2006.01)
*H04B 1/10*    (2006.01)
*H03G 3/34*    (2006.01)

(52) U.S. Cl.
CPC ............. *H04B 1/1027* (2013.01); *H03G 3/341* (2013.01)
USPC ..... 455/226.1; 455/212; 455/218; 455/226.2; 375/217

(58) Field of Classification Search
CPC ........ G08B 3/1016; G08B 3/105; H04B 1/38; H04B 1/1027; H04W 52/0229; H04W 52/028; H04W 88/022; H03G 3/341
USPC ............. 455/226.1, 522, 212, 218, 220, 222, 455/223, 226.2, 70; 375/217, 227, 242; 379/6.3, 201.06, 202; 348/553, 33
See application file for complete search history.

(56) References Cited

U.S. PATENT DOCUMENTS

| 4,119,800 | A | * | 10/1978 | Girardi | 455/410 |
| 4,228,320 | A | * | 10/1980 | Celli et al. | 379/56.3 |
| 4,873,520 | A | * | 10/1989 | Fisch et al. | 340/7.57 |
| 5,303,406 | A |   | 4/1994 | Hansen et al. | |
| 5,881,101 | A | * | 3/1999 | Furman et al. | 375/217 |

FOREIGN PATENT DOCUMENTS

| EP | 1 006 666 | 6/2000 |
| JP | 06 120996 | 4/1994 |

* cited by examiner

*Primary Examiner* — Shaima Q Aminzay
(74) *Attorney, Agent, or Firm* — Frommer Lawrence & Haug LLP

(57) ABSTRACT

An IR receiver having a decision logic circuit for activating or deactivating a squelch. Activation or deactivation of the squelch is effected in dependence on a mean value of the frequency, a variance of the receiver intermediate frequency, a mean value of the audio amplitude, a variance of the audio amplitude and/or a signal strength of the receiver intermediate circuit frequency.

6 Claims, 1 Drawing Sheet

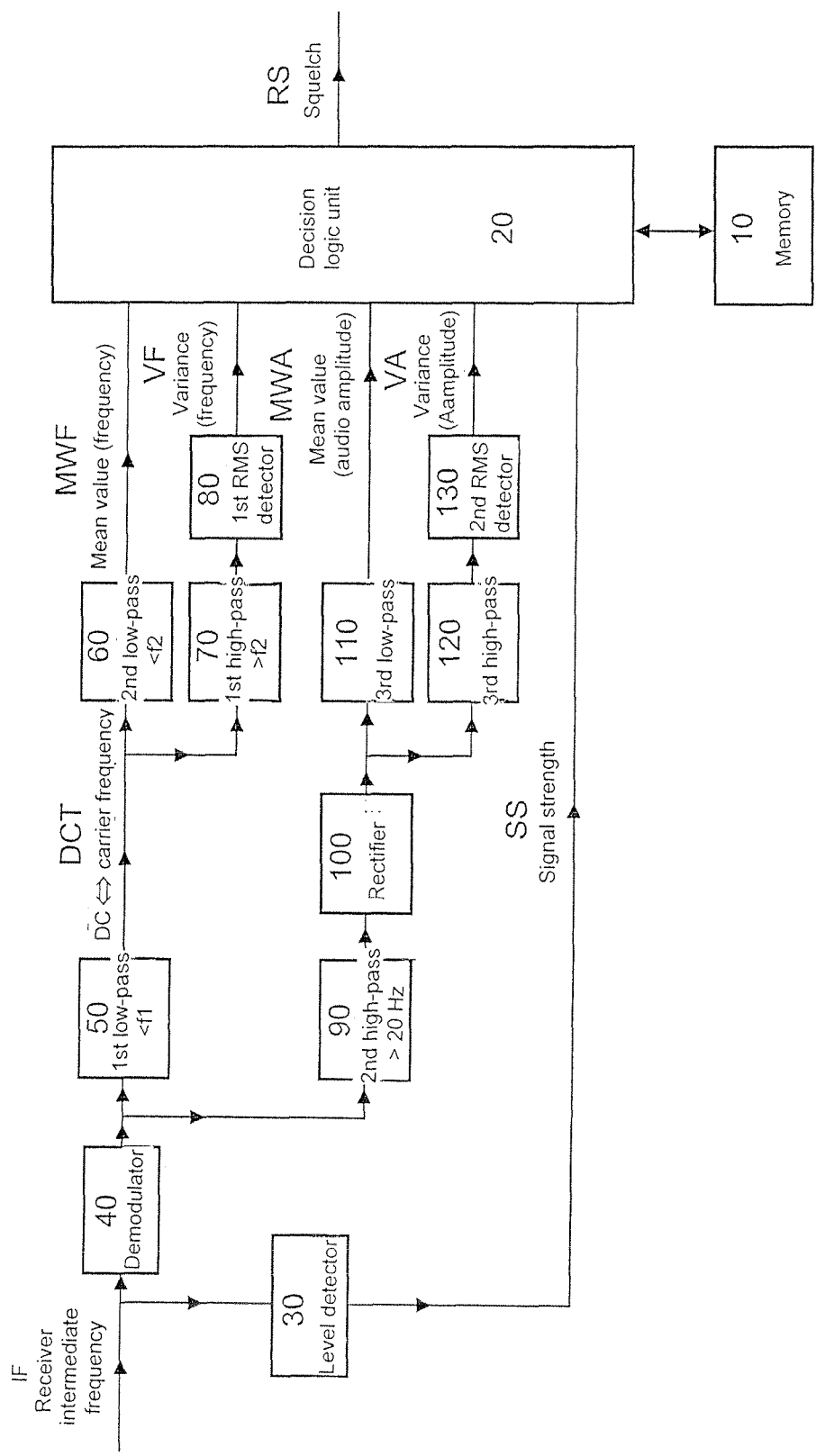

INFRARED RECEIVING UNIT

The present application claims priority from PCT Patent Application No. PCT/EP2009/063086 filed on Oct. 8, 2009, which claims priority from German Patent Application No. DE 10 2008 051 011.4 filed on Oct. 13, 2008, the disclosures of which are incorporated herein by reference in their entirety.

BACKGROUND OF THE INVENTION

1. Field of the Invention

The present invention concerns an IR receiving unit and a method of receiving IR signals.

2. Description of Related Art

In known IR receiving units a squelch effect typically has to be implemented to fade out interference noise during breaks in transmission. That is effected for example by evaluation of the received signal strength RSSI. It is only when the received signal exceeds a predetermined value that it can be amplified or switched through. An alternative possible way of implementing squelch represents analysis of the demodulated noise.

Those two possible options for providing squelch are however not appropriate for infrared communication as, in the relevant frequency range, a fluorescent lamp (or a plasma television or the like) cannot be distinguished from an IR transmitter.

SUMMARY OF THE INVENTION

Therefore an object of the present invention is to provide an IR receiving unit which permits squelch.

Thus there is provided an IR receiver having a decision logic circuit for activating or deactivating a squelch. Activation or deactivation of the squelch is effected in dependence on a mean value of the frequency, a variance of the receiver intermediate frequency, a mean value of the audio amplitude, a variance of the audio amplitude and/or a signal strength of the receiver intermediate circuit frequency.

In an aspect of the present invention the decision logic unit is adapted to activate a squelch if the variance of the frequency exceeds a limit value.

In a further aspect the decision logic unit is adapted to activate a squelch if the mean value of the audio amplitude lies below a predetermined threshold value.

In a further aspect of the invention the decision logic unit is adapted to activate a squelch if the mean value of the audio amplitude falls below a predetermined threshold value and the variance of the audio amplitude is above a predetermined threshold.

The invention also concerns an IR receiver having a decision logic unit for determining whether there is a suitable signal. Determining whether there is a suitable signal is based on a mean value of the frequency, a variance of the frequency, a mean value of the audio amplitude, a variance of the audio amplitude and/or a signal strength of a receiver intermediate circuit frequency.

The invention also concerns a method of activating or deactivating a squelch in an IR receiver. Activation or deactivation of the squelch is effected based on an evaluation of a mean value of the frequency, a variance of the frequency, a mean value of the audio amplitude, a variance of the audio amplitude and/or a signal strength of the receiver intermediate circuit frequency.

The invention concerns the notion of providing an IR receiving unit which derives the signal strength RSSI directly from the receiver intermediate frequency signal. In addition the dc voltage component extracted from the FM demodulator can represent a measurement in respect of the carrier frequency of the reception signal. The dc voltage component can also be averaged in respect of time. In addition the variance in the demodulator dc voltage component represents a measurement for the time fluctuations of the carrier frequency around the mean value. The mean value of the rectified amplitudes downstream of the demodulator represents a measurement in respect of the average volume of the receiving unit. The variance in the rectified audio amplitude represents a measurement in respect of the time fluctuations in volume, that is to say dynamics.

Further configurations of the invention are subject-matter of the appendant claims.

BRIEF DESCRIPTION OF THE DRAWINGS

FIG. 1 shows a block circuit diagram of an IR receiving unit in accordance with a first embodiment.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

FIG. 1 shows a block circuit diagram of an IR receiving unit in accordance with a first embodiment. The IR receiving unit has an FM demodulator 40, a level detector 30, a first low-pass 50, a second low-pass 60, a first high-pass 70, a first RMS detector 80, a second high-pass 90, a rectifier 100, a third low-pass 110, a third high-pass 120, a second RMS detector 130, a decision logic unit 20 and a memory 10. The receiver intermediate frequency is received both by the FM demodulator 40 and also the level detector 30. The level detector 30 determines the signal strength SS or the RSSI (radio signal strength indicator) and outputs that signal strength SS to the decision logic unit 20. The output signal of the FM demodulator 40 is passed both to the first low-pass 50 and also to the second high-pass 90. The limit frequency of the first low-pass represents the frequency f1. The output of the first low-pass 50 represents a dc voltage component of the carrier frequency DCT. That signal is passed to the second low-pass 60 and the second high-pass 70. The output signal of the second low-pass 60 represents a frequency mean value MWF. The limit frequency in that case is f2. The first high-pass 70 has a limit frequency of f2 and the output signal of the high-pass 70 is passed to the first RMS detector 80. The output signal of the first RMS detector 80 represents the variance of the frequency VF.

The output signal of the second high-pass 90 with a limit frequency of at least 20 Hz (that is to say the lower limit of the audible range) is passed to the rectifier 100. The output signal of the rectifier 100 is passed to the third low-pass 110 and the third high-pass 120. The output signal of the third low-pass 110 represents a mean value of the audio amplitude MWA. The output signal of the third high-pass 120 is passed to the second RMS detector 130. The output signal of the second RMS detector 130 represents the variance of the audio amplitude VA or dynamics. The mean value of the frequency MWF, the variants of the frequency VF, the mean value of the audio amplitude MWA, the variance of the audio amplitude VA and/or the signal strength SS can be fed to the decision logic unit 20. The decision logic unit 20 is also connected to a memory 10. The decision logic unit 20 outputs a squelch signal RS as the output signal.

The signal strength SS is thus derived directly from the receiver intermediate frequency signal IF. The mean value of the rectified audio amplitude MWA represents a measurement of the mean volume of the reception signal. The variance of the dc voltage component of the demodulator VA concerns the time fluctuations of the carrier frequency around the mean value and can thus give an indication of the stability of the received carrier frequency. The variance of the rectified audio amplitude is a measurement in respect of the time fluctuations in volume.

The decision logic unit 20 checks whether the received signal strength SS is below or above a predetermined threshold. If the signal strength SS is below a predetermined threshold or if the carrier frequency fluctuates by a predetermined amount (if the variance of the frequency is above a reference value), then reception of an adequate signal is not possible. In such a case it can be assumed that the receiver is in the transition range of a plurality of transmitters or interference sources. If however the carrier frequency fluctuates within a predetermined amount and the variance is thus below a threshold value, it can be assumed that only a carrier frequency is being received. It can further be assumed that the received carrier frequency has a sufficient signal-to-noise ratio at the input of the receiver. In the case where there is a carrier frequency having adequate stability then the frequency can be determined by using the mean value of the frequency MWF. That frequency can be stored in the memory 10 and later used for tuning or re-establishing the received carrier frequency.

If the audio amplitude is used for evaluation and the mean value of the audio amplitude MWA is above a predetermined threshold value then there can be an interference and the amplitude of the corresponding frequency deviation can be outside the specification.

If the mean value of the amplitude MWA is below a predetermined threshold closer consideration may be necessary. If the variance of the audio amplitude is below a threshold then there can be little dynamics, that is to say the signal is not modulated or is little modulated. As an alternative thereto there can be a constant envelope curve. In that case however it is still necessary to determine whether there is a meaningful signal such as for example music or speech. If however the variance of the audio amplitude is greater than a predetermined threshold then there is sufficient dynamics there, that is to say there is a high degree of probability that the signal represents a meaningful signal such as for example music or speech.

If the variance of the audio amplitude VA is above a predetermined threshold then the reception signal is sufficiently modulated.

If the frequency is stable and the frequency is within the admissible tolerances and the audio amplitude is within an admissible range and the dynamics are sufficiently high then a corresponding signal can be considered as meaningful and the corresponding carrier frequency can be stored in a memory so that the receiving unit can later fall back thereon.

If the frequency is stable and the audio amplitude is within the admissible range and the carrier frequency is sufficiently close to the stored frequency then the received signal can also be selected. If a signal has been selected and the carrier frequency is slightly beside the stored carrier frequency then the stored frequency can be selected if the deviation takes place slowly in respect of time. When a signal has been selected or acknowledged as meaningful the squelch RS can then be enabled.

In a further aspect of the present invention an IR receiving unit has a decision logic unit as described in the first embodiment. In that case however the decision logic unit does not serve exclusively to activate or deactivate a squelch but to determine whether there is a meaningful signal or not. Based on the result, a part of the IR receiver can be controlled. For example a squelch can be controlled or a transmitter search procedure can be carried out.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

The invention claimed is:

1. An infrared receiver comprising:
   a decision logic circuit configured to activate or deactivate a squelch and to determine whether a meaningful signal is present;
   a demodulator adapted to demodulate a received intermediate frequency;
   a high-pass filter adapted to perform a high-pass filtering of an output of the demodulator; and
   a rectifier for rectifying an output signal of the high-pass filter;
   wherein the squelch is deactivated when a meaningful signal is determined;
   wherein the decision logic circuit is configured to determine whether a signal strength of a received receiver intermediate circuit frequency signal is below a predetermined threshold, and to determine in this case that the signal is not a meaningful signal;
   wherein the decision logic circuit is configured to determine whether a variance of a carrier frequency of the received receiver intermediate frequency signal is above a predetermined threshold value, and to determine that this signal is not a meaningful signal in this case;
   wherein the decision logic circuit is configured to determine whether a mean value of an audio amplitude is above a predetermined threshold, and to determine that the signal is not a meaningful signal in this case; and
   wherein an output signal of the rectifier corresponds to the mean value of the audio amplitude.

2. The infrared receiver as set forth in claim 1;
   wherein the decision logic circuit is configured to determine whether the variance of the audio amplitude of the receiver intermediate circuit frequency signal is greater than a predetermined threshold, and to determine that this signal is not a meaningful signal in this case.

3. The infrared receiver as set forth in claim 1;
   wherein the decision logic circuit is configured to store the mean value of the carrier frequency of the received signal in a memory when the variance of the carrier frequency is below a predetermined threshold value.

4. The infrared receiver as set forth in claim 3;
   wherein the decision logic circuit is configured to determine whether the carrier frequency is sufficiently close to a stored frequency, and to determine that the signal is a meaningful signal in this case.

5. An infrared receiver comprising:
   a decision logic circuit which is configured to determine whether a received signal represents a meaningful signal based on an evaluation of a variance of a frequency, a mean value of an audio amplitude, and a signal strength of a receiver intermediate frequency signal;
   a demodulator adapted to demodulate a received intermediate frequency;
   a high-pass filter adapted to perform a high-pass filtering of an output of the demodulator; and
   a rectifier for rectifying an output signal of the high-pass filter;
   wherein an output signal of the rectifier corresponds to the mean value of the audio amplitude.

6. A method of activating or deactivating a squelch in an infrared receiver, the method comprising:
   deactivating the squelch when the signal is determined as a meaningful signal;
   determining whether a signal strength of a received receiver intermediate frequency signal is below a predetermined threshold value, and determining in this case that the signal is not a meaningful signal;
   determining whether a variance of a carrier frequency of the received receiver intermediate frequency signal is above a predetermined threshold, and determining in this case that the signal is not a meaningful signal; and
   determining whether a mean audio signal amplitude is above a predetermined threshold value, and determining in this case that the signal is not a meaningful signal;
   demodulating a received intermediate frequency to obtain a demodulated output;
   high-pass filtering the demodulated output to obtain a high-pass-filtered output signal; and
   rectifying the high-pass output signal to obtain a rectified output signal;
   wherein the rectified output signal corresponds to the mean audio signal amplitude.

\* \* \* \* \*